United States Patent
Hsia et al.

(10) Patent No.: US 8,476,746 B2
(45) Date of Patent: Jul. 2, 2013

(54) PACKAGE STRUCTURE ENHANCING MOLDING COMPOUND BONDABILITY

(75) Inventors: Cheng-Yu Hsia, Miao-Li (TW); Chiao-Jung Yeh, Miao-Li (TW)

(73) Assignee: Kun Yuan Technology Co., Ltd. (TW)

( * ) Notice: Subject to any disclaimer, the term of this patent is extended or adjusted under 35 U.S.C. 154(b) by 349 days.

(21) Appl. No.: 12/805,718

(22) Filed: Aug. 17, 2010

(65) Prior Publication Data
US 2011/0266662 A1 Nov. 3, 2011

(30) Foreign Application Priority Data
Apr. 29, 2010 (TW) ................................ 99207859 U

(51) Int. Cl.
*H01L 23/13* (2006.01)

(52) U.S. Cl.
USPC .................. 257/676; 257/730; 257/E23.052; 257/E23.046; 438/123

(58) Field of Classification Search
USPC .... 257/676, 730, E23.052, E23.046; 438/123
See application file for complete search history.

(56) References Cited

U.S. PATENT DOCUMENTS

| | | | | |
|---|---|---|---|---|
| 2001/0007780 A1* | 7/2001 | Minamio et al. | | 438/106 |
| 2002/0031869 A1* | 3/2002 | Minamio et al. | | 438/127 |
| 2006/0108673 A1* | 5/2006 | Germain et al. | | 257/678 |
| 2009/0294932 A1* | 12/2009 | Sahasrabudhe et al. | | 257/666 |
| 2010/0258921 A1* | 10/2010 | Chang Chien et al. | | 257/676 |

* cited by examiner

*Primary Examiner* — Steven J Fulk
(74) *Attorney, Agent, or Firm* — Bacon & Thomas, PLLC

(57) ABSTRACT

A leadframe enhancing molding compound bondability includes a chip base and a pin holder. The chip bases includes a chip pad and a support, wherein the chip pad includes a side protrusion extending out of the support, and the side protrusion has a lower surface, and the support has a sidewall, and wherein the lower surface and the sidewall interconnect at an intersection line, and the lower surface is formed upwardly with a recess. Further, a pin holder includes a pin stand and a seat, wherein the pin stand has an edge portion extending out of the seat, the edge portion has a lower surface, the seat has a sidewall, and the lower surface and the sidewall interconnect at a crossing line. The lower surface of the pin stand is formed upward with a recess. As such, the bondability between the leadframe and the molding compound can be greatly enhanced.

5 Claims, 6 Drawing Sheets

PACKAGE STRUCTURE ENHANCING MOLDING COMPOUND BONDABILITY

BACKGROUND OF THE INVENTION

1. Field of the Invention

The present invention relates to a leadframe enhancing molding compound bondability and a package structure thereof, and more particularly, to a leadframe for enhancing bondability with the molding compound encapsulating a semiconductor package, and to a structure of the semiconductor package.

2. Description of Related Art

Referring to FIG. 1A, a cross-sectional view illustrating a conventional semiconductor package, a semiconductor chip 91 is fixed on a conventional leadframe 9, where the semiconductor chip 91 is electrically connected with the leadframe 9 through gold wires 92. The semiconductor chip 91, the gold wires 92, and the leadframe 9 are encapsulated by molding compound 93 such that the purpose of protection and insulation can be achieved. However, along with continuous development of technology, electronic components have been developed rapidly toward the tendency of light, thin, short, and small. Therefore, in response to the continuous size reduction of the electronic components, the size of the leadframe 9 is also reduced continuously. As a result, the contact area between the leadframe 9 and the molding compound 93 becomes restricted.

Since the contact portion between the leadframe 9 and the molding compound 93 is smooth, and since the contact area between the leadframe 9 and the molding compound 93 reduces greatly, the bondability therebetween decreases significantly. This will worsen delamination between the leadframe 9 and the molding compound 93, or even result in singulation which causes detachment of leads, seriously affecting the product yield during a manufacturing process. It is noted that quad flat non-lead packages become a mainstream of package manufacturing processes. A quad flat non-lead package is characterized in that external leads are absent, namely, external leads for electrically connecting outside, as used in a conventional quadrangular QFP semiconductor package, are not formed therein. This makes it possible for the QFP package to reduce the size of the semiconductor package, though the phenomenon of delamination between the leadframe and the molding compound gets even worse.

Now referring to FIG. 1B, a cross-sectional view illustrating another conventional semiconductor package, along with continuous progress of manufacturing technique, a conventional leadframe 94 has been developed to have a "T" shape or inverted "L" shape, characterized in that through a T-shape or inverted-L-shape extension platform 95, the bondability between the leadframe 94 and a molding compound 96 can be increased. Nevertheless, in spite of the fact that this measure may somewhat improve the bondability, such improvement is considered insufficient, and the situation of delamination can still take place easily.

SUMMARY OF THE INVENTION

The present invention is to provide a leadframe enhancing molding compound bondability, comprising a chip base and a pin holder, wherein the chip base includes a chip pad and a support. The chip pad includes a side protrusion extending out of the support, and the side protrusion has a lower surface, and the support has a sidewall. Further, the lower surface and the sidewall interconnect at an intersection line. In addition, the lower surface is formed upwardly with a recess adjacent to the intersection line, and that the recess extends along at least part of the intersection line.

Further, according to the present invention, the pin holder includes a pin stand and a seat, wherein the pin stand has an edge portion extending out of the seat. Besides, the edge portion has a lower surface, and that the seat has a sidewall, where the lower surface and the sidewall interconnect at a crossing line. The lower surface is formed with a recess adjacent to and along at least part of the crossing line. As a result, the present invention, due to the provision of the side protrusion, the edge portion, and the recesses, can greatly increase the contact area between the leadframe and the molding compound so as to significantly improve the bondability between the leadframe and the molding compound, and to decrease the likelihood of delamination therebetween.

The recesses formed at the leadframe for enhancing bondability of the molding compound may have the same depth, or, of course, different depths. According to the present invention, the depths of the recesses can be controlled through setting conditions during manufacturing processes, so as to further adjust the graspability, and to achieve an optimal holdability, of the leadframe on the molding compound. Besides, at least one metal pin is arranged at the pin stand of the pin holder for electrically connecting a chip.

Further, according to the present invention, the recesses formed at the leadframe may be of arc recesses, respectively, while the arc recesses may be semicircular recesses. However, the arc recesses should not be limited to the semicircular recesses only, but rather three-quarter circular recesses, elliptical recesses, or the like, will also do. In addition, the recesses may be polygonal recesses, respectively, including trapezoidal recesses, triangular recesses, rectangular recesses, conical recesses, or equivalents.

Still further, according to the present invention, another aspect of the package structure enhancing molding compound bondability comprises a leadframe, a chip, at least one wire, and a molding compound. The leadframe includes a chip base and a pin holder, wherein the chip base includes a chip pad and a support. The chip pad has a lower surface and that the support has a sidewall, where the lower surface and the sidewall interconnect at an intersection line. In addition, the lower surface is formed with a recess adjacent to and extending along part of the intersection line.

According to the present invention, the pin holder includes a pin stand and a seat, wherein the pin stand has a lower surface and that the seat has a sidewall, where the lower surface interconnects with the sidewall at a crossing line. The lower surface is formed with a recess adjacent to and along part of the crossing line. Further, according to the present invention, the pin stand of the pin holder is laid with at least one metal pin.

Further, according to the present invention, the chip is fixed on the chip pad, where the chip, at its upper surface, is provided with at least one solder spot. The at least one wire is electrically connected with the at least one solder spot of the chip and the at least one metal pin of the pin holder. In the present invention, the molding compound encapsulates the chip, at least one wire, and part of the leadframe, and fills the recesses. As a result, through the arrangement of the side protrusion, the edge portion, and the recesses, the bondability between the leadframe and the molding compound is enhanced.

Still further, according to the present invention, the chip is fixed on the chip pad and corresponds to the support, and does not extend out of the sidewall of the support. This is because during a die bonding process for the chip, the chip pad underneath must bear a greater loading stress. Preferably, the chip does not extend out of the sidewall of the support, nor is it located right above the recess so as to prevent the lower side protrusion, or the recess, from bending or breaking due to subject to an over loading stress. In addition, according to the present invention, the at least one wire is electrically connected with the at least one solder spot of the chip and the at least one metal pin located above the seat of the pin holder. Similarly, this will prevent the edge portion from bending or breaking during a wire bonding process due to an over loading stress.

Other objects, advantages, and novel features of the present invention will become more apparent from the following detailed descriptions when taken in conjunction with the accompanying drawings.

DETAILED DESCRIPTION OF THE PREFERRED EMBODIMENTS

Figure 1A:
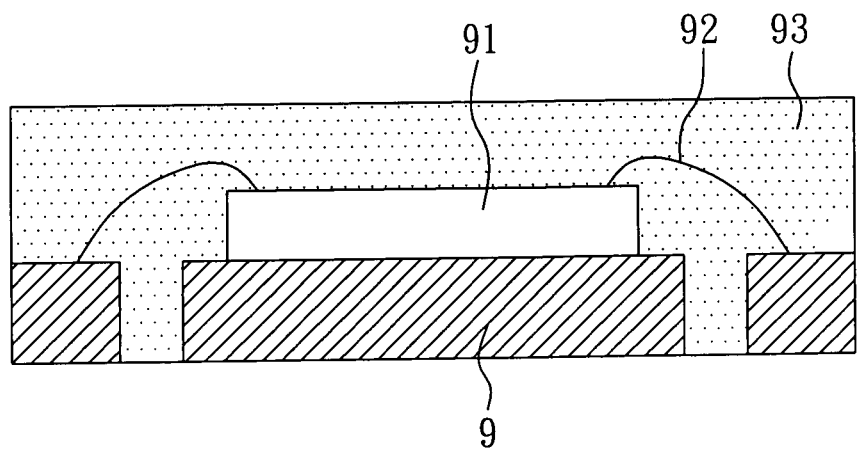
FIG. 1A is a cross-sectional view illustrating a conventional semiconductor package.
Figure 1B:
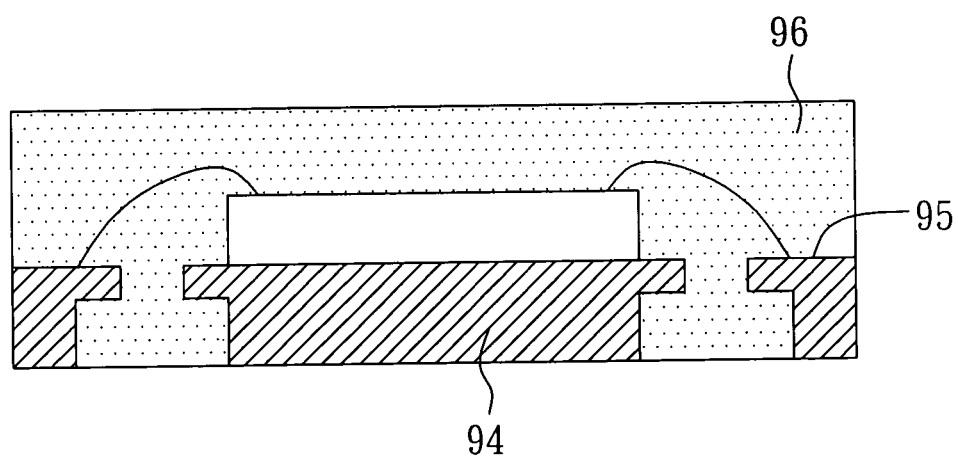
FIG. 1B is a cross-sectional view illustrating another conventional semiconductor package.
Figure 2:
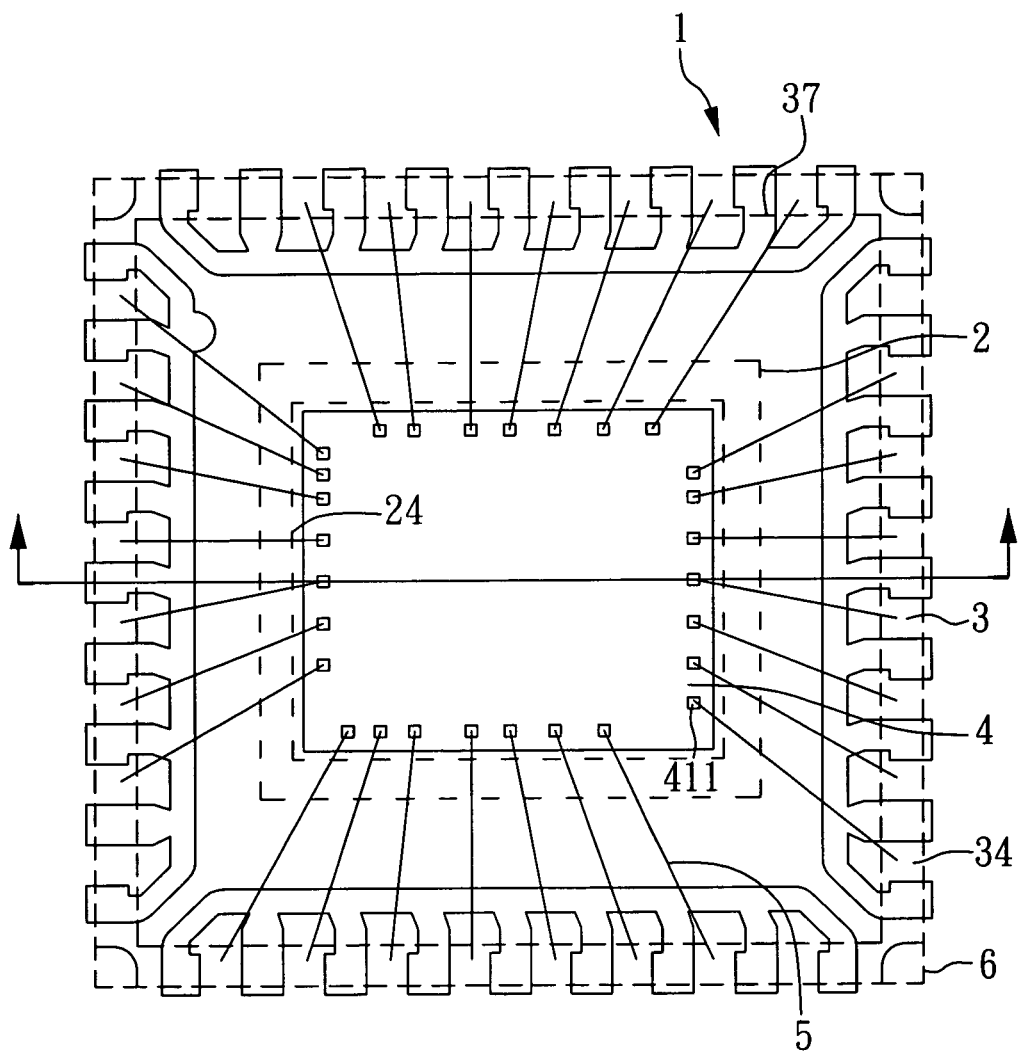
FIG. 2 is a top view illustrating a package structure enhancing molding compound bondability according to a first embodiment of the present invention.
Figure 3A:
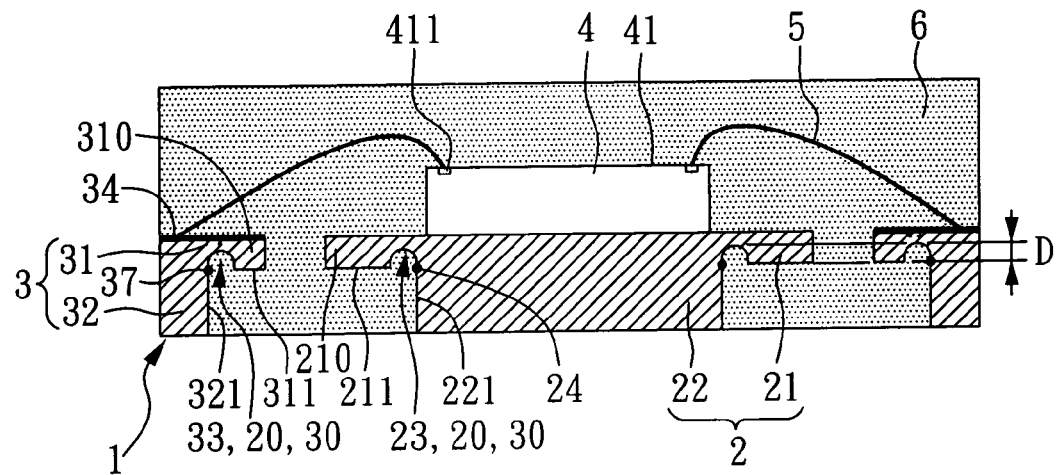
FIG. 3A is a cross-sectional view taken from FIG. 2.
Figure 3B:
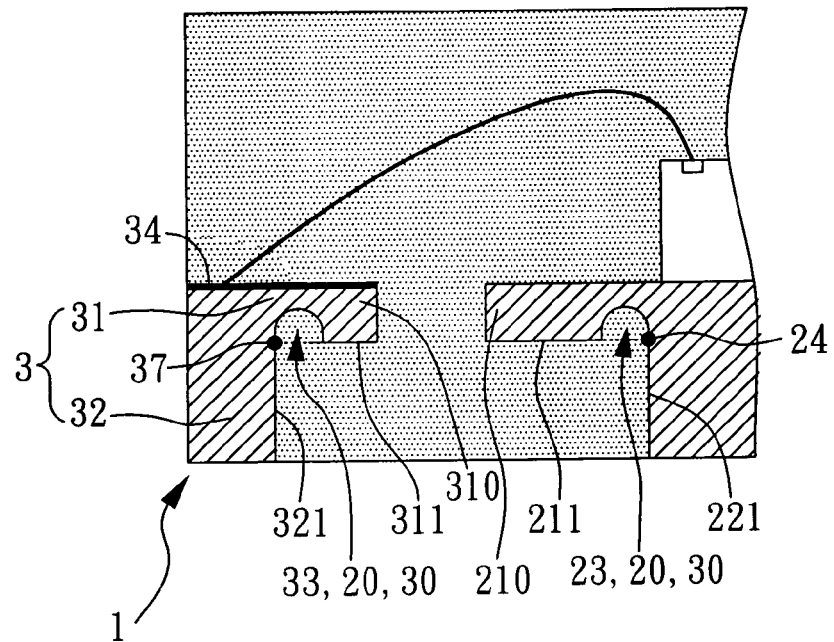
FIG. 3B is an enlarged cross-sectional view illustrating part of the package structure as shown in FIG. 3A.

Referring to FIG. 2, a top view illustrating a package structure enhancing molding compound bondability according to a first embodiment of the present invention, to FIG. 3A, a cross-sectional view taken from FIG. 2, and to FIG. 3B, an enlarged cross-sectional view illustrating part of the package structure as shown in FIG. 3A, the package structure comprises primarily a leadframe 1, a chip 4, a plurality of wires 5, and a molding compound 6.

According to the present invention, the leadframe 1 includes a chip base 2 and a pin holder 3, wherein the chip base 2 includes a chip pad 21 and a support 22. The chip pad 21 is integrally connected with an upper portion of the support 22, wherein a side protrusion 210 extends sideward from a sidewall 221 of the support 22, and the side protrusion 210 has a lower surface 211. Further, the lower surface 211 and the sidewall 221 interconnect at an intersection line 24, namely, the lower surface 211 and the sidewall 221 are connected at the intersection line 24. In addition, the lower surface 211 is formed upwardly with a recess 23 adjacent to and extending along the intersection line 24.

Further, as shown in FIGS. 3A and 3B, the pin holder 3 includes a pin stand 31 and a seat 32, wherein the pin stand 31 has a lower surface 311 and that the seat 32 has a sidewall 321. Similarly, the pin stand 31 is integrally connected with an upper portion of the seat 32, where an edge portion 310 extends out of the sidewall 321 of the seat 32. Besides, a lower surface 311 of the edge portion 310 interconnects with the sidewall 321 of the seat 32 at a crossing line 37, namely, the lower surface 311 and the sidewall 321 are connected at the crossing line 37. The lower surface 311 is formed upward with a recess 33 adjacent to and along the crossing line 37. Further, according to the present embodiment, the pin stand 31 of the pin holder 3 is laid with a metal pin 34, normally made of silver or lead, and fully plated on an upper surface of the pin stand 31.

In the present embodiment, the recesses 23,33 are formed by etching, and both have a depth D. Thereby, through setting conditions during a manufacturing process, the size of the depth D can be controlled so as to further adjust the graspability, and to achieve an optimal holdability, of the leadframe 1 on the molding compound 6. In addition, according to the present embodiment, the recesses 23,33 are provided along the entire intersection line 24 and crossing line 37, respectively, where the recesses 23,33 can be made by a laser manufacturing process or equivalent. As such, the recesses 23,33 can be arranged, section by section, along at least part of the intersection line 24 and the crossing line 37, respectively. In the present embodiment, the recesses 23,33 are arc recesses 20, respectively; or preferably, semicircular recesses 30.

Further, there is shown in FIG. 3A a chip 4 fixed on the chip pad 21 of the chip base 2, where the chip 4, at its upper surface 41, is provided with a plurality of solder spots 411. According to the present embodiment, the chip 4 is fixed on the chip pad 21 and corresponds to the support 22, and does not extend out of the sidewall 221 of the support 22, nor is it located right above the recess 23. This is because during a die bonding process for the chip 4, the chip pad 21 underneath must bear a greater loading stress, and the arrangement according to the present embodiment will prevent the lower side protrusion 210, or the recess 23, from bending or breaking due to subject to an over loading stress.

Also shown in FIG. 3A are the plural wires 5 which are electrically connected with the solder spots 411 of the chip 4 and the metal pin 34 of the pin holder 3. In the present embodiment, the plural wires 5 are electrically connected with the solder spots 411 of the chip 4 and the metal pin 34 (located above the seat 32) of the pin holder 3. Neither are the wires 5 located right above the recess 33. Similarly, this will prevent the edge portion 310 and the recess 33, during a wire bonding process, from bending or breaking.

Still further, the molding compound 6 encapsulates the chip 4, at least one wire 5, and part of the leadframe 1, and fills the recesses 23,33. As a result, through the arrangement of the side protrusion 210, the edge portion 310, and the recesses 23,33, not only the bonding dimension between the leadframe 1 and the molding compound 6 increases, but also the bondability between the leadframe 1 and the molding compound 6 is greatly enhanced thanks to the structural locking characteristic. As such, the molding compound can be prevented from delamination at any direction, and yield rate be improved, and cost greatly reduced.

Figure 4:
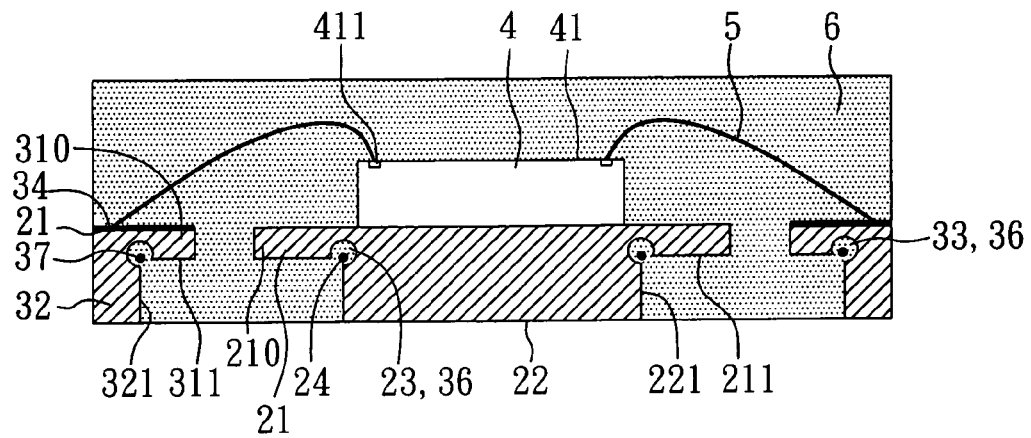
FIG. 4 is a cross-sectional view illustrating a package structure enhancing molding compound bondability according to a second embodiment of the present invention.

Referring to FIG. 4, a cross-sectional view illustrating a package structure enhancing molding compound bondability according to a second embodiment of the present invention, the second embodiment differs from the first embodiment primarily in that for the first embodiment, the recesses 23,33 are semicircular recess 30, and are located entirely at the lower surface 211 of the chip pad 21 and at the lower surface 311 of the pin stand 31; while for the second embodiment, the recesses 23,33 are three-quarter circular recesses 36, and are located at the lower surface 211 of the chip pad 21 and the sidewall 221 of the support 22, and at the lower surface 311 of the pin stand 31 and the sidewall 321 of the seat 32.

Figure 5:
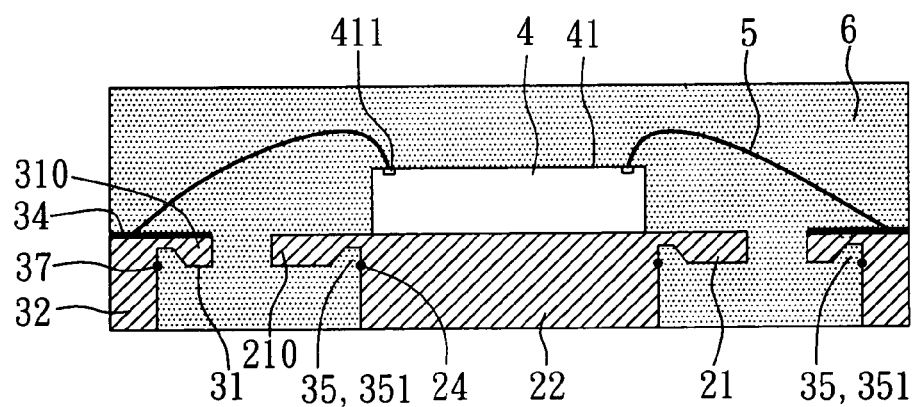
FIG. 5 is a cross-sectional view illustrating a package structure enhancing molding compound bondability according to a third embodiment of the present invention.
Figure 6:
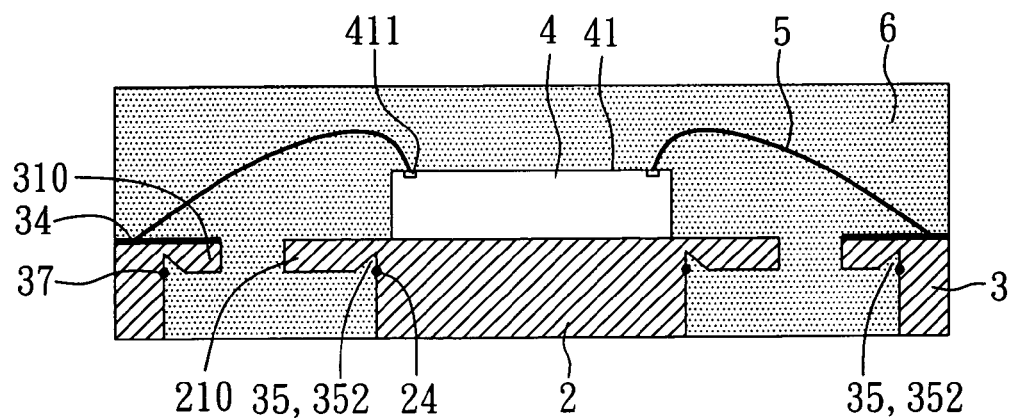
FIG. 6 is a cross-sectional view illustrating a package structure enhancing molding compound bondability according to a fourth embodiment of the present invention.
Figure 7:
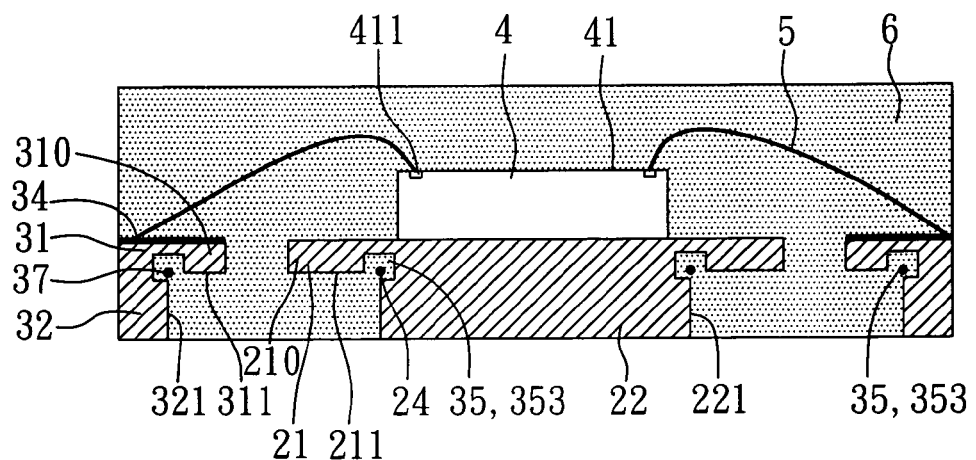
FIG. 7 is a cross-sectional view illustrating a package structure enhancing molding compound bondability according to a fifth embodiment of the present invention.
Figure 8:
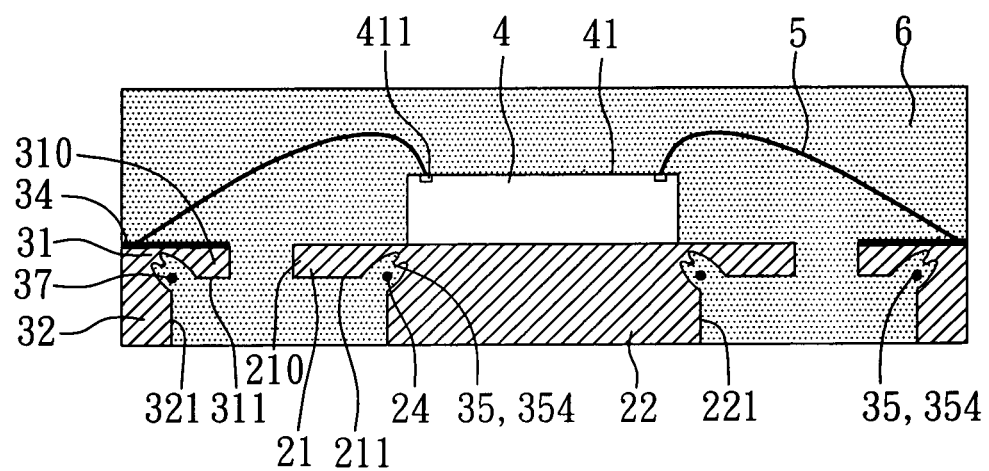
FIG. 8 is a cross-sectional view illustrating a package structure enhancing molding compound bondability according to a sixth embodiment of the present invention.

Now referring to FIGS. 5, 6, 7 and 8, cross-sectional views illustrating package structures enhancing molding compound bondability according to a third, fourth, fifth and sixth embodiments of the present invention, these embodiments are different from the first and second embodiments primarily in that for the third embodiment, as shown in FIG. 5, the recesses 23,33 are polygonal recesses 35, and preferably, trapezoidal recesses 351; for the fourth embodiment, as shown in FIG. 6, the recesses 23,33 are also polygonal recesses 35, but preferably, triangular recesses 352; as regards the fifth embodiment, as shown in FIG. 7, the recesses 23,33 are still polygonal recesses 35, though preferably, rectangular recesses 353 and are located at the lower surface 211 of the chip pad 21 and the sidewall 221 of the support 22, respectively. Regarding the sixth embodiment, as shown in FIG. 8, the recesses 23,33 are polygonal recesses 35, and preferably, irregular polygonal recesses 354. These embodiments attempt to indicate that the recesses 23,33 according to the present invention can be of any configurations.

Although the present invention has been explained in relation to its preferred embodiments, it is to be understood that many other possible modifications and variations can be made without departing from the scope of the invention as hereinafter claimed.

What is claimed is:

1. A package structure enhancing molding compound bondability, comprising:
 a leadframe, including a chip base and a pin holder, wherein the chip base includes a chip pad and a support, the chip pad includes a side protrusion extending out of the support, and the side protrusion has a lower surface, and the support has a sidewall, and wherein the lower surface of the chip pad and the sidewall of the support interconnect at an intersection line, the lower surface of the chip pad is formed upwardly with a recess adjacent to and extending along part of the intersection line, and wherein the pin holder includes a pin stand and a seat, the pin stand has an edge portion extending out of the seat, the edge portion has a lower surface, the seat has a sidewall, and wherein the lower surface of the pin stand and the sidewall of the seat interconnect at a crossing line, and the lower surface is formed upwardly with a recess adjacent to and along at least part of the crossing line, and wherein the pin stand of the pin holder is laid with at least one metal pin;
 a chip, being fixed on the chip pad, wherein the chip, at its upper surface, is provided with at least one solder spot;
 at least one wire, being electrically connected with the at least one solder spot of the chip and the at least one metal pin of the pin holder; and
 a molding compound, for encapsulating the chip, the at least one wire, and part of the leadframe, and for filling the recesses.

2. The package structure enhancing molding compound bondability as claimed in claim 1, wherein the recesses are arc recesses, respectively.

3. The package structure enhancing molding compound bondability as claimed in claim 1, wherein the recesses are polygonal recesses, respectively.

4. The package structure enhancing molding compound bondability as claimed in claim 1, wherein the chip is fixed on the chip pad and corresponds to the support.

5. The package structure enhancing molding compound bondability as claimed in claim 1, wherein the at least one wire is electrically connected with the at least one solder spot of the chip and the at least one metal pin located above the seat of the pin holder.

* * * * *